United States Patent
Duan et al.

(10) Patent No.: US 11,904,360 B2
(45) Date of Patent: Feb. 20, 2024

(54) ACOUSTIC WAVE TRANSDUCER AND DRIVING METHOD THEREOF

(71) Applicants: Beijing BOE Technology Development Co., Ltd., Beijing (CN); BOE Technology Group Co., Ltd., Beijing (CN)

(72) Inventors: Liye Duan, Beijing (CN); Mengjun Hou, Beijing (CN); Yao Lu, Beijing (CN); Zongmin Liu, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 632 days.

(21) Appl. No.: 17/266,445

(22) PCT Filed: May 21, 2020

(86) PCT No.: PCT/CN2020/091496
§ 371 (c)(1),
(2) Date: Feb. 5, 2021

(87) PCT Pub. No.: WO2020/233656
PCT Pub. Date: Nov. 26, 2020

(65) Prior Publication Data
US 2021/0291230 A1    Sep. 23, 2021

(30) Foreign Application Priority Data
May 22, 2019   (CN) .......................... 201910430497.3

(51) Int. Cl.
*B06B 1/06*    (2006.01)
*B06B 3/04*    (2006.01)
(Continued)

(52) U.S. Cl.
CPC .............. *B06B 1/0607* (2013.01); *B06B 3/04* (2013.01); *H10N 30/1051* (2023.02); *H10N 30/875* (2023.02)

(58) Field of Classification Search
CPC .... B06B 1/0607; B06B 3/04; H10N 30/1051; H10N 30/875
See application file for complete search history.

(56) References Cited

U.S. PATENT DOCUMENTS 9,656,300 B2 *  5/2017  Yamamoto ............ B06B 1/0622
10,211,619 B2 *  2/2019  Gunnar .................... H02H 3/38
(Continued)

FOREIGN PATENT DOCUMENTS

CN         1686582 A    10/2005
CN       201518016 U     6/2010
(Continued)

OTHER PUBLICATIONS

First Office Action dated Jul. 7, 2020 for application No. CN201910430497.3 with English translation attached.

*Primary Examiner* — J. San Martin
(74) *Attorney, Agent, or Firm* — Nath, Goldberg & Meyer; Joshua B. Goldberg

(57) ABSTRACT

The present disclosure provides an acoustic wave transducer and a driving method thereof. The acoustic wave transducer includes cell groups, at least part of which each include acoustic wave transducer cells configured to perform a same operation, each acoustic wave transducer cell being configured to perform at least one of: converting an acoustic wave signal into an electrical signal and converting an electrical signal into an acoustic wave signal; and array element signal terminals, each of which is coupled to at least two adjacent cell groups, and is coupled to different cell groups through different switch devices, each switch device being configured to control connection and disconnection between the
(Continued)

array element signal terminal and the cell group coupled to the switch device, and the cell groups coupled to an array element signal terminal and the cell groups coupled to an adjacent array element signal terminal are partly the same.

16 Claims, 3 Drawing Sheets

(51) Int. Cl.
  *H10N 30/87* (2023.01)
  *H10N 30/00* (2023.01)

(56) References Cited

U.S. PATENT DOCUMENTS

| | | | |
|---|---|---|---|
| 10,807,123 B2* | 10/2020 | Matsuda | G01N 29/2437 |
| 10,966,682 B2* | 4/2021 | Maruyama | B06B 1/0269 |
| 11,378,670 B2* | 7/2022 | Kojima | B06B 1/0629 |
| 2008/0013405 A1* | 1/2008 | Moon | B06B 1/0629 367/92 |
| 2008/0021324 A1 | 1/2008 | Seto | |
| 2013/0208572 A1* | 8/2013 | Klee | B06B 1/0688 367/140 |
| 2013/0294201 A1* | 11/2013 | Hajati | G01N 29/2406 310/334 |
| 2014/0341392 A1 | 11/2014 | Lambert et al. | |

FOREIGN PATENT DOCUMENTS

| | | |
|---|---|---|
| CN | 102505935 A | 6/2012 |
| CN | 102854256 A | 1/2013 |
| CN | 105232146 A | 1/2016 |
| CN | 109789445 A | 5/2019 |
| CN | 110142194 A | 8/2019 |
| JP | 2007240487 A | 9/2007 |
| JP | 2007244415 A | 9/2007 |

\* cited by examiner

ACOUSTIC WAVE TRANSDUCER AND DRIVING METHOD THEREOF

CROSS-REFERENCE TO RELATED APPLICATION

This is a National Phase Application filed under 35 U.S.C. 371 as a national stage of PCT/CN2020/091496, filed on May 21, 2020, an application claiming the benefit of priority to Chinese Patent Application No. 201910430497.3 filed on May 22, 2019, the contents of each of which are incorporated herein in their entirety by reference.

TECHNICAL FIELD

The present disclosure relates to the technical field of acoustic wave transducers, and particularly relates to an acoustic wave transducer and a driving method of the acoustic wave transducer.

BACKGROUND

An acoustic wave transducer is used for detecting an acoustic wave signal such as an ultrasonic wave signal or an infrasonic wave signal, and converting the acoustic wave signal into an electrical signal. By taking an ultrasonic transducer as an example, it can be applied to clinical medical imaging.

SUMMARY

The present disclosure provides an acoustic wave transducer including: a plurality of cell groups, at least part of which each include a plurality of acoustic wave transducer cells configured to perform a same operation, each acoustic wave transducer cell being configured to perform at least one of: converting an acoustic wave signal into an electrical signal and converting an electrical signal into an acoustic wave signal; and a plurality of array element signal terminals, each of which is coupled to at least two adjacent cell groups, and is coupled to different cell groups through different switch devices, each switch device being configured to control connection and disconnection between the array element signal terminal and the cell group that are coupled to the switch device, and the at least two adjacent cell groups coupled to any one of the plurality of array element signal terminals and the at least two adjacent cell groups coupled to an adjacent array element signal terminal have an intersection.

In some embodiments, the plurality of cell groups are arranged in a first direction, and the plurality of acoustic wave transducer cells included in each of the at least part of the plurality of cell groups are arranged in a second direction, the second direction intersecting the first direction.

In some embodiments, a cell group coupled to at least two array element signal terminals is a multiplexing cell group; and each multiplexing cell group is coupled to different array element signal terminals in the at least two array element signal terminals through different switch devices.

In some embodiments, the multiplexing cell group includes one cell group signal terminal, all the acoustic wave transducer cells included in the multiplexing cell group are coupled to the one cell group signal terminal, and the one cell group signal terminal is coupled to different array element signal terminals in the at least two array element signal terminals through different switch devices, respectively.

In some embodiments, the multiplexing cell group includes at least two cell group signal terminals, all the acoustic wave transducer cells included in the multiplexing cell group are coupled to each of the at least two cell group signal terminals, and each of the at least two cell group signal terminals is coupled to a corresponding one of the at least two array element signal terminals through a corresponding switch device.

In some embodiments, the acoustic wave transducer includes a plurality of multiplexing cell groups, wherein the plurality of multiplexing cell groups are adjacent to each other, and other cell groups of the plurality of cell groups than the plurality of multiplexing cell groups are on two sides of the plurality of multiplexing cell groups along the first direction and are each coupled to a corresponding array element signal terminal through one switch device.

In some embodiments, each array element signal terminal is coupled to M adjacent cell groups through M switch devices, each switch device corresponds to one cell group, M is greater than or equal to 2, a number of cell groups in the intersection between the at least two adjacent cell groups coupled to any one of the plurality of array element signal terminals and the at least two adjacent cell groups coupled to the adjacent array element signal terminal is N, N is greater than or equal to 1 and less than M.

In some embodiments, M is an even number, and N=M/2.

In some embodiments, the acoustic wave transducer cell is a capacitive micromachined ultrasonic transducer, the capacitive micromachined ultrasonic transducer includes a first electrodes and a second electrodes opposite to each other, the second electrode is coupled to a common signal terminal, first electrodes of the capacitive micromachined ultrasonic transducers in each cell group are coupled together and further coupled to a corresponding array element signal terminal through a corresponding switch device.

In some embodiments, the switch device is a micromechanical switch, and the micromechanical switch includes a control terminal coupled to a control signal terminal, a first terminal electrically coupled to a corresponding cell group and a second terminal electrically coupled to a corresponding array element signal terminal.

In some embodiments, 5≤M≤10.

The present disclosure also provides a driving method of an acoustic wave transducer, the acoustic wave transducer being the acoustic wave transducer according to the present disclosure. The driving method includes: providing a turn-on control signal or a turn-off control signal to each switch device so that at least part of the switch devices coupled to each of the plurality of array element signal terminals are turned on, and each cell group is in electrical connection with only one array element signal terminal.

In some embodiments, each array element signal terminal is in electrical connection with a same number of cell groups at a same timing.

In some embodiments, each array element signal terminal is in electrical connection with the cell groups adjacent to each other at a same timing.

In some embodiments, the plurality of array element signal terminals include a first array element signal terminal and a second array element signal terminal which are adjacent; and at a same timing, the cell groups in electrical connection with the first array element signal terminal are adjacent to the cell groups in electrical connection with the second array element signal terminal.

In some embodiments, the plurality of cell groups are arranged in a first direction;

at a first timing and a subsequent second timing, the number of the cell groups in electrical connection with each array element signal terminal is unchanged; and the first cell group in the first direction of the cell groups in electrical connection with any one of the array element signal terminals at the first timing is adjacent to the first cell group in the first direction of the cell groups in electrical connection with the array element signal terminal at the second timing.

DETAILED DESCRIPTION

Figure 1:
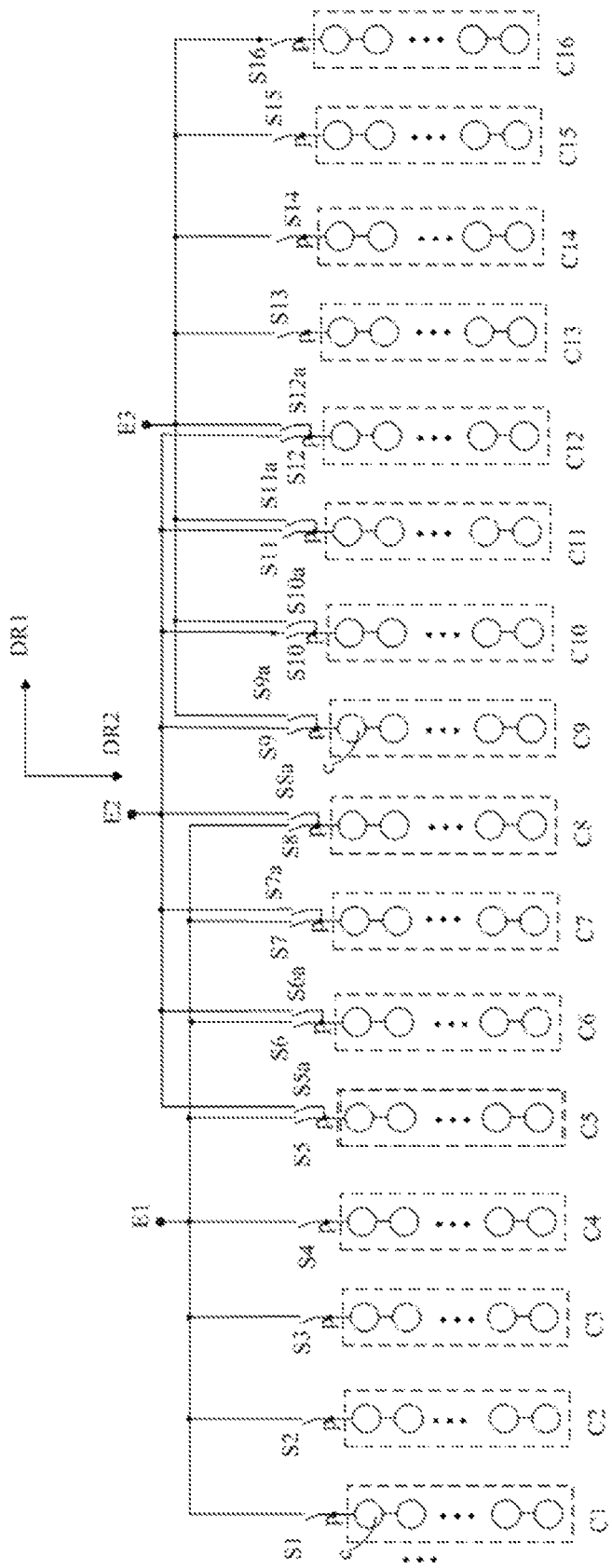
FIG. 1 is a schematic structural diagram of an acoustic wave transducer according to an embodiment of the present disclosure.

In order to make those skilled in the art better understand the technical solutions of the present disclosure, the present disclosure will be described in further detail below with reference to the accompanying drawings and the specific embodiments.

The minimum unit of an acoustic wave transducer is known as an acoustic wave transducer cell, which is called a cell for short. Common cells include a capacitive micromachined ultrasonic transducer (cMUT) and a piezoelectric micromachined ultrasonic transducer (pMUT). The capacitive micromachined ultrasonic transducer (cMUT) is an extremely small, membrane-like device having an electrode that converts acoustic vibrations of a received ultrasonic signal into modulated capacitance. For the purpose of transmission, charges in a capacitor need to be modulated to make a diaphragm of the device vibrate, thereby transmitting an acoustic wave. The basic structure of the capacitive micromachined ultrasonic transducer (cMUT) is a conductive thin film or diaphragm structure suspended over a conductive electrode with a small gap. When a voltage is applied between the conductive thin film or diaphragm and the electrode, the conductive thin film or diaphragm is attracted to the conductive electrode by a coulomb force. If the applied voltage changes over time, the position of the conductive thin film or diaphragm will also change over time, and acoustic energy is generated and radiates from a surface of the device as the conductive thin film or diaphragm moves.

The acoustic energy that an individual cell of the acoustic wave transducer can emit and detect is limited. Generally, a plurality of cells arranged in an array may be taken as a whole (referred to as an array element), and work together to obtain larger transmission power and receive a signal. Electrodes of the respective cells in the array element are coupled in the same way. The array elements are arranged in one direction. In normal operation, a plurality of array elements cooperate temporally and can emit acoustic waves with directivity. If all the array elements emit acoustic waves simultaneously, focusing positions of the acoustic waves are fixed due to the fixed mechanical structure of the acoustic wave transducer. If part of the array elements emit acoustic waves and part of the array elements do not emit acoustic waves, the number of focusing positions of the acoustic waves is limited because the positions of the array elements are fixed. Therefore, the adjustment of the focus position of the acoustic wave transducer may not be fine enough.

It can be understood herein that a first element being adjacent to a second element means that no other element is present between the first and second elements. For example, two adjacent array element signal terminals mean that no other array element signal terminal exists between the two array element signal terminals; two adjacent cell groups mean that no other cell group exists between the two cell groups. Further, herein, "a first element being in electrical connection with a second element" means that the first element and the second element are in an electrically conducting state; however, "a first element being coupled to a second element" does not mean that the first element and the second element are in an electrically conducting state, but includes a case where the first element and the second element are coupled by a switch device.

The embodiments of the present disclosure provide an acoustic wave transducer, which includes a plurality of array element signal terminals and a plurality of cell groups. At least part of the plurality of cell groups each include a plurality of acoustic wave transducer cells configured to be coupled to a same signal terminal (e.g., cell group signal terminal) to perform a same operation. Each of the plurality of array element signal terminals is coupled to at least two adjacent cell groups, and the array element signal terminal is coupled to different cell groups through different switch devices. Each switch device is configured to control connection and disconnection between the array element signal terminal and the cell group coupled to the switch device, and the cell groups coupled to an array element signal terminal and the cell groups coupled to an array element signal terminal adjacent to the array element signal terminal are partly the same (i.e., have an intersection).

FIG. 1 is a schematic structural diagram of an acoustic wave transducer according to an embodiment of the present disclosure. As shown in FIG. 1, the acoustic wave transducer includes three array element signal terminals (a first array element signal terminal E1, a second array element signal terminal E2, and a third array element signal terminal E3) and 16 cell groups (a first cell group C1 to a sixteenth cell group C16).

Each of the cell groups C1 to C16 includes a plurality of acoustic wave transducer cells c. The number and arrangement of the acoustic wave transducer cells c in each cell group are the same. The cell group is taken as the minimum unit that is controlled independently. A cell group signal terminal p of the cell group is used as a unified signal interface of the minimum unit to the outside. The acoustic wave transducer cell c serves as the minimum unit of energy conversion of the acoustic wave transducer, and can convert an acoustic wave signal into an electrical signal and can also convert an electrical signal into an acoustic wave signal.

The cell group signal terminal p may be configured to output the electrical signal detected by each acoustic wave transducer cell c in the cell group where the cell group signal terminal p is located to the array element signal terminal, and input the electrical signal provided to the array element signal terminal to each acoustic wave transducer cell c coupled to the array element signal terminal p, so that the acoustic wave transducer cells c are controlled to generate acoustic wave vibration according to the unified electrical signal. For example, in the case where each of the acoustic wave transducer cells c is a capacitive micromachined ultrasonic transducer, first electrodes of the acoustic wave transducer cells c are electrically coupled together, and are electrically equivalent, and second electrodes of the acoustic wave transducer cells c are coupled to a common signal terminal. In this case, if the cell group signal terminal p is electrically coupled to the first electrode of one acoustic wave transducer cell c in the cell group, reading and writing of all the acoustic wave transducer cells c in the cell group can be achieved. Each acoustic wave transducer cell c in the cell group performs a same action, such as emitting a same acoustic wave or converting an acoustic wave signal in a relatively small area into an electrical signal to be supplied to the corresponding cell group signal terminal p. The number of the cell group signal terminal(s) p of one cell group may be one (as shown in FIG. 1) or plural (as shown in FIG. 2), but they are electrically equivalent, that is, they are electrically coupled together.

Figure 2:
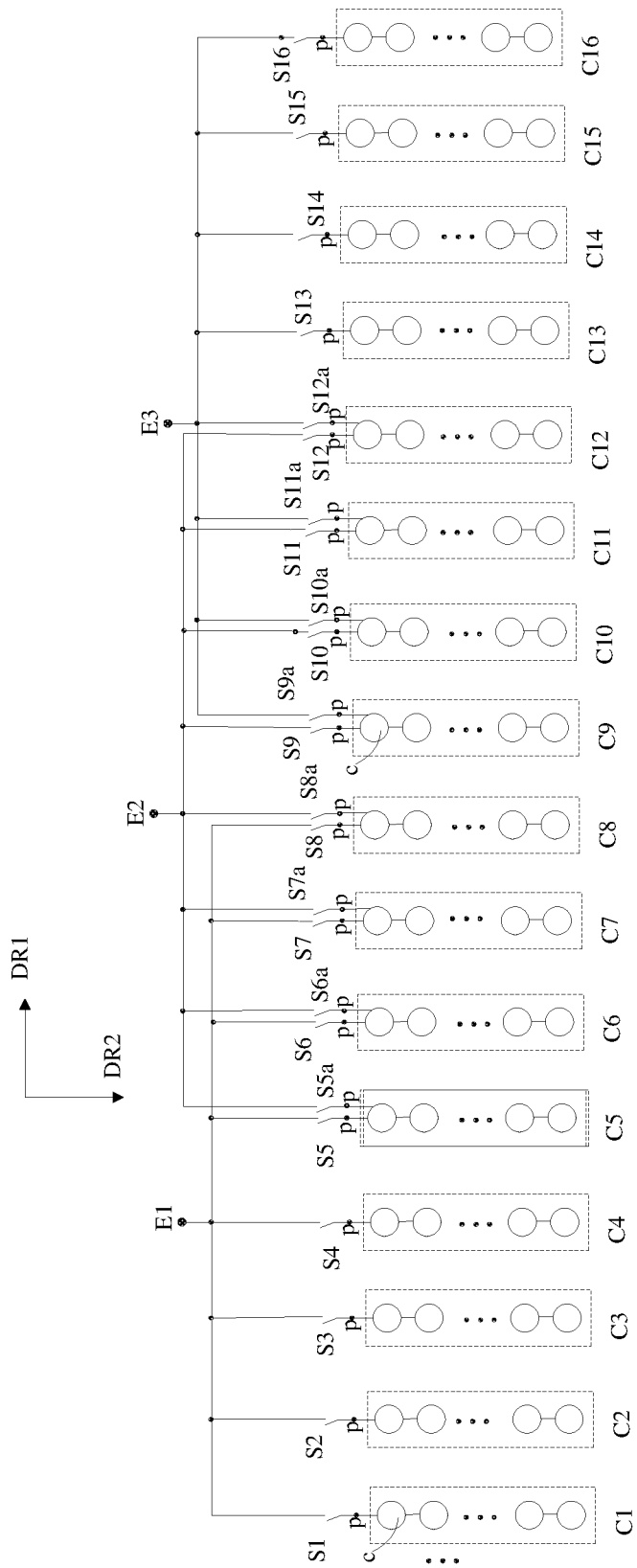
FIG. 2 is a schematic structural diagram of an acoustic wave transducer according to an embodiment of the present disclosure.

In the embodiments of the present disclosure, as shown in FIGS. 1 and 2, the respective cell groups are arranged in a first direction DR 1. The arrangement of the cell groups is one-dimensional. In FIGS. 1 and 2, the first direction DR1 is a row direction. It should be noted that the cell groups may also be arranged along two intersecting directions, for example, arranged in a plane; alternatively, the cell groups may be arranged in three intersecting directions, for example, in a 3-dimensional space. The embodiments of the present disclosure are not limited thereto.

In the embodiments of the present disclosure, each array element signal terminal is coupled to multiple cell groups (i.e., to the cell group signal terminals p of the respective cell groups) through switch devices. Each array element signal terminal may be in electrical connection with one or more cell groups selected from the plurality of cell groups. In some embodiments, each of the switch devices (e.g., switch devices S1 to S16 and S5a to S12a in FIG. 1) is coupled to one corresponding cell group signal terminal p. The composition of the array element is adjusted in units of cell groups. The cell group in electrical connection with the array element signal terminal can be changed, so that the shape and the position of the array elements corresponding to a certain array element signal terminal can be flexibly adjusted. The flexibility in configuration of each array element is greatly improved, so that the number of possible focusing positions of the acoustic wave transducer is increased, the flexibility in adjustment of the focusing position of the acoustic wave transducer is also greatly improved, and more precise adjustment of the focusing position can be realized.

In most cases, the array elements are adjacent to each other (i.e., there are no other cell group between cell groups, which are close to each other, of adjacent array elements). In order to ensure that the array elements are kept adjacent to each other when the shape and position of the array element are adjusted, it is necessary that the cell groups coupled to an array element signal terminal and the cell groups coupled to an adjacent array element signal terminal are partly the same.

As shown in FIG. 1, the first array element signal terminal E1 is coupled to the first cell group C1 to the eighth cell group C8 through the switch devices S1 to S8, the second array element signal terminal E2 is coupled to the fifth cell group C5 to the eighth cell group C12 through the switch devices S5a to S8a and S9 to S12, and the third array element signal terminal E3 is coupled to the ninth cell group C9 to the sixteenth cell group C16 through the switch devices S9a to S12a and S13 to S16, respectively.

At a first timing, the first array element signal terminal E1 is in electrical connection with the first cell group C1 to the fourth cell group C4, the second array element signal terminal E2 is in electrical connection with the fifth cell group C5 to the eighth cell group C8, and the third array element signal terminal is in electrical connection with the ninth cell group C9 to the twelfth cell group C12. This is a distribution state of the array elements. The above-described electrical connection state can be realized by controlling on and off states of each switch device.

At a second timing immediately after the first timing, the first array element signal terminal E1 is in electrical connection with the second cell group C2 to the fifth cell group C5, the second array element signal terminal E2 is in electrical connection with the sixth cell group C6 to the ninth cell group C9, and the third array element signal terminal E3 is in electrical connection with the tenth cell group C10 to the thirteenth cell group C13. This is another distribution state of the array elements.

It can be seen that in the above two states, the position where the acoustic waves are focused is finely adjusted in units of the width of one cell group. Such fine adjustment of the focus is not possible with existing solutions.

In some embodiments, the cell group includes a plurality of acoustic wave transducer cells c arranged in a second direction DR2, and the second direction DR2 is a direction intersecting the first direction DR1. For example, as shown in FIG. 1, each cell group is constituted by a same number of acoustic wave transducer cells c arranged in the column direction. Since the width of the cell group is made as narrow as possible, the minimum adjusting distance of the focus can also be made as small as possible. A single cell group may also be constituted by two columns of acoustic wave transducer cells c arranged in the second direction DR2. Alternatively, the arrangement of the acoustic transducer cells in the cell group may be irregular. The second direction DR2 is perpendicular to the first direction DR1 in FIG. 1, but the second direction DR2 may be not perpendicular to the first direction DR1.

The cell group coupled to at least two array element signal terminals is a multiplexing cell group. Each multiplexing cell group is coupled to different array element signal terminals in the at least two array element signal terminals through different switch devices. The multiplexing cell group can be selectively in electrical connection with one of the at least two array element signal terminals.

Referring to FIG. 2, the fifth cell group C5 to the twelfth cell group C12 are multiplexing cell groups, each multiplexing cell group includes two cell group signal terminals p to each of which all the acoustic wave transducer cells c included in the multiplexing cell group are coupled, and each of the two cell group signal terminals p is coupled to one of the two array element signal terminals through one switch device.

Referring to FIG. 1, the fifth cell group C5 to the twelfth cell group C12 are multiplexing cell groups, each multiplexing cell group includes one cell group signal terminal p to which all the acoustic wave transducer cells c included in the multiplexing cell group are coupled, and the one cell group signal terminal p is respectively coupled to two different array element signal terminals through two switch devices.

The multiplexing cell groups are adjacent to each other, and the cell groups other than the multiplexing cell groups are positioned on two sides of the multiplexing cell groups along the first direction and are respectively coupled to the corresponding array element signal terminals through the switch devices.

Referring to FIG. 1, through the switch devices, four cell groups on the left side of the multiplexing cell groups are coupled to only the first array element signal terminal E1 and four cell groups on the right side of the multiplexing cell groups are coupled to only the third array element signal terminal E3.

In some embodiments, each array element signal terminal is coupled to M adjacent cell groups through M switch devices respectively, each switch device corresponds to one cell group, M is larger than or equal to 2, the number of the same cell groups between the cell groups coupled to an array element signal terminal and the cell groups coupled to an adjacent array element signal terminal is N, and N is larger than or equal to 1 and smaller than M. In this embodiment, the cell groups coupled to an array element signal terminal are offset from the cell groups coupled to an adjacent array element signal terminal by a fixed number of cell groups. In the case where the array elements need to be adjacent to each other and the number of cell groups included in each array element is the same, the number of possible arrangement modes of the array elements can be maximized with such an arrangement.

As shown in FIG. 1, each of the array element signal terminals E1 to E3 is coupled to eight adjacent cell groups, and the number of the same cell groups between the cell groups coupled to an array element signal terminal and the cell groups coupled to an adjacent array element signal terminal is four. As such, in the case where one array element is constituted by four adjacent cell groups (that is, four adjacent cell groups are in electrical connection with a same array element signal terminal to constitute one array element), and there are no cell group between adjacent array elements, there are the following 5 schemes of configuring an array element: 1) the first array element signal terminal E1 is in electrical connection with the first cell group C1, the second cell group C2, the third cell group C3 and the fourth cell group C4; 2) the first array element signal terminal E1 is in electrical connection with the second cell group C2, the third cell group C3, the fourth cell group C4 and the fifth cell group C5; 3) the first array element signal terminal E1 is in electrical connection with the third cell group C3, the fourth cell group C4, the fifth cell group C5 and the sixth cell group C6; 4) the first array element signal terminal E1 is in electrical connection with the fourth cell group C4, the fifth cell group C5, the sixth cell group C6 and the seventh cell group C7; 5) the first array element signal terminal E1 is in electrical connection with the fifth cell group C5, the sixth cell group C6, the seventh cell group C7, and the eighth cell group C8.

In some embodiments, M is an even number, and N=M/2, i.e., the embodiment shown in the above example. Needless to say, the number of the cell groups coupled to each array element signal terminal may also be an odd number, and the number of the cell groups coupled to both two adjacent array element signal terminals may also be flexibly set.

In some embodiments, the acoustic wave transducer cell c is a capacitive micromachined ultrasonic transducer, the capacitive micromachined ultrasonic transducer includes a first electrode and a second electrode opposite to each other, the second electrode is a ground electrode coupled to a common signal terminal, the first electrodes of the capacitive micromachined ultrasonic transducers in each cell group are coupled together and further coupled to the corresponding array element signal terminal through the corresponding switch device. Needless to say, other types of acoustic wave transducer cells c (e.g., piezoelectric micromachined ultrasonic transducer, etc.) may be coupled in the same way as described above to achieve fine adjustment of the focus. Each small circle shown in FIG. 1 represents the first electrode of the capacitive micromachined ultrasonic transducer, and the ground electrode opposite thereto is not shown. The vibration of the acoustic wave may bring about a vibration of the first electrode of the capacitive micromachined ultrasonic transducer, thereby changing its capacitance. The strength of the acoustic wave can be calculated by detecting the change of the capacitance.

In some embodiments, the switch device is a micromechanical switch. The micromechanical switch device may be manufactured by a semiconductor process, and the on-resistance (i.e., the resistance in the on-state) is sufficiently small. The micromechanical switch has a control terminal, a first terminal, and a second terminal. The first terminal and the second terminal are in a connected or disconnected state according to different voltages of the control terminal. A control signal terminal needs to be provided to provide a control signal for the control terminal of the micromechanical switch, the first terminal is electrically coupled to the corresponding cell group signal terminal, and the second terminal is electrically coupled to the corresponding array element signal terminal. Needless to say, other types of switch devices may be used in the acoustic wave transducer.

In some embodiments, $5 \leq M \leq 10$. In practical applications, the design needs to be performed in consideration of factors such as the area occupied by the switch device, the area occupied by the routing, and the like. The number of the cell groups with which each array element signal terminal can be in electrical connection may be 5 to 10.

The present disclosure also provides a driving method applied to the acoustic wave transducer according to the present disclosure, including: providing a turn-on control signal or a turn-off control signal to each switch device, so that at least part of the switch devices coupled to each array element signal terminal are turned on, and each cell group is in electrical connection with only one array element signal terminal.

Providing the turn-on control signal or the turn-off control signal to each switch device means independently controlling the on-off state between each cell group and the corresponding array element signal terminal, and further independently configuring the shape (e.g., shape characteristics, such as the number of cell groups constituting the array element, whether adjacent cell groups are adjacent, etc.) and the position of the array element corresponding to each array element signal terminal (i.e., the array element constituted by the cell groups in electrical connection with the array element signal terminal).

Because the shape and the position of each array element can be flexibly adjusted, the focusing position of the acoustic wave transducer can also be flexibly adjusted. Because whether the array element signal terminal is in electrical connection with a cell group can also be flexibly configured (i.e., whether the array element signal terminal forms an array element is flexibly configured), the number of the array elements can also be flexibly adjusted. This further increases the flexibility of focus adjustment of the acoustic wave transducer.

Because a single cell group cannot belong to two different array elements at the same time, it needs be ensured that the cell groups in electrical connection with any two array element signal terminals have no intersection when the on-off state of each switch device is controlled.

In some embodiments, each array element signal terminal is in electrical connection with the same number of cell groups at a same timing. In some embodiments, each array element signal terminal is in electrical connection with a plurality of cell groups adjacent to each other at a same timing.

In some embodiments, the plurality of array element signal terminals include a first array element signal terminal and a second array element signal terminal which are adjacent to each other, and at a same timing, the cell groups in electrical connection with the first array element signal terminal are adjacent to the cell groups in electrical connection with the second array element signal terminal. At a first timing and a subsequent second timing, the shape and relative position relation of the cell groups in electrical connection with each array element signal terminal are unchanged; the first cell group in the first direction DR1 of the cell groups in electrical connection with any one of the array element signal terminals at the first timing is adjacent to the first cell group in the first direction DR1 of the cell groups in electrical connection with the array element signal terminal at the second timing.

The shape of the cell groups in electrical connection with each array element signal terminal (e.g., the number of and the spacing between the cell groups in electrical connection with each array element signal terminal) is unchanged. The relative position relation between the cell groups respectively in electrical connection with the array element signal terminals is unchanged. That is, for the adjacent first and second array element signal terminals, the positional relationship between the first cell group in the first direction DR1 of the cell groups in electrical connection with the first array element signal terminal and the first cell group in the first direction DR1 of the cell groups in electrical connection with the second array element signal terminal is unchanged. For example, the two are always kept apart by two cell groups.

Referring to FIG. 1, for example, at a certain timing, the first array element signal terminal E1 is in electrical connection with the first cell group C1, the second cell group C2 and the third cell group C3, and the corresponding switch devices (i.e., the switch devices S1 to S3) are in an on state; the second array element signal terminal E2 is in electrical connection with the fifth cell group C5, the sixth cell group C6 and the seventh cell group C7, and the corresponding switch devices (i.e., the switch devices S5a to S7a) are in the on state; the remaining switch devices are in an off state. In this case, the first cell group C1, the second cell group C2, and the third cell group C3 constitute a first array element, and the fifth cell group C5, the sixth cell group C6, and the seventh cell group C7 constitute a second array element.

It should be noted that the number of the cell groups in electrical connection with the array element signal terminal may be unequal, and the cell groups in electrical connection with the array element signal terminal may also be not adjacent to each other. Those skilled in the art can make adjustment flexibly according to the actual situation.

In some embodiments, at a same timing, each array element signal terminal is in electrical connection with a same number of adjacent cell groups.

Referring to FIG. 1, for example, at a certain timing, the first array element signal terminal E1 is in electrical connection with the first cell group C1, the second cell group C2, and the third cell group C3, and the corresponding switch devices (switch devices S1 to S3) are in the on state; the second array element signal terminal E2 is in electrical connection with the fifth cell group C5, the sixth cell group C6 and the seventh cell group C7, and the corresponding switch devices (switch devices S5a to S7a) are in the on state; the third array element signal terminal E3 is in electrical connection with the ninth cell group C9, the tenth cell group C10 and the eleventh cell group C11, and the corresponding switch devices (switch devices S9a to S11a) are in the on state; the remaining switch devices are in the off state. In this case, the first cell group C1, the second cell group C2, and the third cell group C3 constitute a first array element, the fifth cell group C5, the sixth cell group C6, and the seventh cell group C7 constitute a second array element, and the ninth cell group C9, the tenth cell group C10, and the eleventh cell group C11 constitute a third array element. The spacing between adjacent array elements in this example is equal. Needless to say, for the requirement of focus adjustment, the spacings between adjacent array elements may also be unequal by controlling the on-off states of each switch device.

According to the above embodiment, the shape of the array element is fixed, but the position of the array element at a timing is shifted from the position of the array element at a previous timing by one cell group. Needless to say, the focusing position is also shifted by the size of one cell group.

In some embodiments, the first cell group in the first direction DR1 of the cell groups in electrical connection with any one of the array element signal terminals at a first timing is adjacent to the first cell group in the first direction DR1 of the cell groups in electrical connection with the array element signal terminal at a subsequent second time. Based on the acoustic wave transducer according to the present disclosure, the shape and position of the array element at a timing may be different from the shape and position of the array element at a subsequent timing, thereby achieving focus adjustment.

Figure 3:
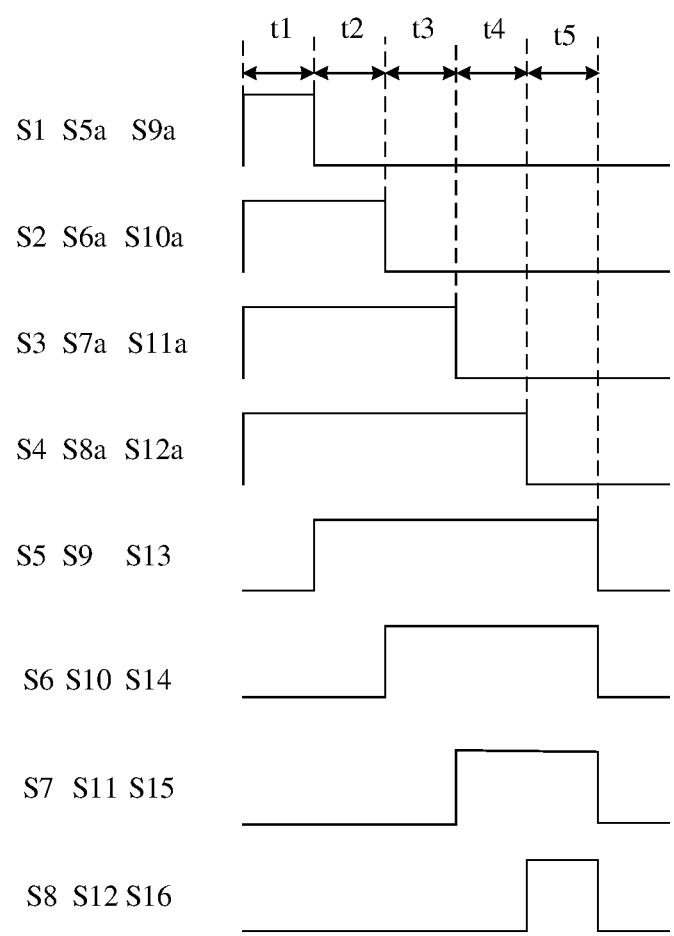
FIG. 3 is a driving timing diagram of an acoustic wave transducer according to an embodiment of the present disclosure.

One manner of focus adjustment based on the acoustic wave transducer according to the present disclosure is described below in conjunction with FIG. 3. A high-level signal in FIG. 3 is an active signal.

In a first time period t1, the switch devices S1 to S4 are turned on, and the first cell group C1 to the fourth cell group C4 are in electrical connection with the first array element signal terminal E1 to form a first array element; the switch devices S5a to S8a are turned on, and the fifth cell group C5 to the eighth cell group C8 are in electrical connection with the second array element signal terminal E2 to form a second array element; the switch devices S9a to S12a are turned on, and the ninth cell group C9 to the twelfth cell group C12 are in electrical connection with the third array element signal terminal E3 to form a third array element.

In a second time period t2, the switch devices S2 to S5 are turned on, and the second cell group C2 to the fifth cell group C5 are in electrical connection with the first array element signal terminal E1 to form a first array element; the switch devices S6a to S8a and S9 are turned on, and the sixth cell group C6 to the ninth cell group C9 are in electrical connection with a second array element signal terminal E2 to form a second array element; the switch devices S10a to Sl2a and S13 are turned on, and the tenth cell group C10 to thirteenth cell group C13 are in electrical connection with the third array element signal terminal E3 to form a third array element.

In a third time period t3, the switch devices S3 to S6 are turned on, and the third cell group C3 to the sixth cell group C6 are in electrical connection with the first array element signal terminal E1 to form a first array element; the switch devices S7a to S8a and S9 to S10 are turned on, and the seventh cell group C7 to the tenth cell group C10 are in electrical connection with the second array element signal terminal E2 to form a second array element; the switch devices S11a to S12a and S13 to S14 are turned on, and the eleventh cell group C11 to the fourteenth cell group C14 are in electrical connection with the third array element signal terminal E3 to form a third array element.

In a fourth time period t4, the switch devices S4 to S7 are turned on, and the fourth cell group C4 to the seventh cell group C7 are in electrical connection with the first array element signal terminal E1 to form a first array element; the switch devices S8a and S9 to S11 are turned on, and the eighth cell group C8 to the eleventh cell group C11 are in electrical connection with the second array element signal terminal E2 to form a second array element; the switch devices S12a and S13 to S15 are turned on, and the twelfth cell group C12 to the fifteenth cell group C15 are in electrical connection with the third array element signal terminal E3 to form a third array element.

In a fifth time period t5, the switch devices S5 to S8 are turned on, and the fifth cell group C5 to the eighth cell group C8 are in electrical connection with the first array element signal terminal E1 to form a first array element; the switch devices S9 to S12 are turned on, and the ninth cell group C9 to the twelfth cell group C12 are in electrical connection with the second array element signal terminal E2 to form a second array element; the switch devices S13 to S16 are turned on, and the thirteenth cell group C13 to the sixteenth cell group C16 are in electrical connection with the third array element signal terminal E3 to form a third array element.

It should be noted that, in the above examples, the acoustic wave transducer is described as including three array element signal terminals, but the number of the array element signal terminals in the actual acoustic wave transducer may be tens or hundreds.

It should be noted that, by taking FIG. 1 as an example, a fourth array element signal terminal may be further added, and the fourth array element signal terminal is coupled to the thirteenth cell group C13 to the sixteenth cell group C16 through switch devices, respectively. If driving is performed in the manner shown in FIG. 3, i.e., each array element is required to be constituted by four adjacent cell groups, and there is no cell group between adjacent array elements, the thirteenth cell group C13 to the sixteenth cell group C16 can form one array element in the first time period. That is, in the first time period, four array elements can be configured, and in the rest time periods, only three array elements can be configured.

When the number of the array element signal terminals is large enough, for example, the difference between the influences of 100 array elements and 101 array elements on the acoustic wave detection is acceptable. Therefore, by taking FIG. 1 as an example, it is not much influenced whether the fourth array element signal terminal is added.

It could be understood that the above embodiments are merely exemplary embodiments adopted for describing the principle of the present disclosure, but the present disclosure is not limited thereto. Various variations and improvements may be made by those of ordinary skill in the art without departing from the spirit and essence of the present disclosure, and these variations and improvements shall also be regarded as falling into the protection scope of the present disclosure.

The invention claimed is:

1. An acoustic wave transducer, comprising:
   a plurality of cell groups, at least part of which each comprise a plurality of acoustic wave transducer cells configured to perform a same operation, each acoustic wave transducer cell being configured to perform at least one of: converting an acoustic wave signal into an electrical signal and converting an electrical signal into an acoustic wave signal; and
   a plurality of array element signal terminals, each of which is coupled to at least two adjacent cell groups, and is coupled to different cell groups through different switch devices, each switch device being configured to control connection and disconnection between the array element signal terminal and the cell group coupled to the switch device, and the at least two adjacent cell groups coupled to any one of the plurality of array element signal terminals and the at least two adjacent cell groups coupled to an adjacent array element signal terminal have an intersection.

2. The acoustic wave transducer of claim 1, wherein the plurality of cell groups are arranged in a first direction, and the plurality of acoustic wave transducer cells comprised in each of the at least part of the plurality of cell groups are arranged in a second direction, the second direction intersecting the first direction.

3. The acoustic wave transducer of claim 2, wherein a cell group coupled to at least two array element signal terminals is a multiplexing cell group; and
   each multiplexing cell group is coupled to different array element signal terminals in the at least two array element signal terminals through different switch devices.

4. The acoustic wave transducer of claim 3, wherein the multiplexing cell group comprises one cell group signal terminal, all the acoustic wave transducer cells comprised in the multiplexing cell group are coupled to the one cell group signal terminal, and the one cell group signal terminal is coupled to different array element signal terminals in the at least two array element signal terminals through different switch devices, respectively.

5. The acoustic wave transducer of claim 3, wherein the multiplexing cell group comprises at least two cell group signal terminals, all the acoustic wave transducer cells comprised in the multiplexing cell group are coupled to each of the at least two cell group signal terminals, and each of the at least two cell group signal terminals is coupled to a corresponding one of the at least two array element signal terminals through a corresponding switch device.

6. The acoustic wave transducer of claim 3, comprising a plurality of multiplexing cell groups, wherein the plurality of multiplexing cell groups are adjacent to each other, and other cell groups of the plurality of cell groups than the plurality of multiplexing cell groups are on two sides of the plurality of multiplexing cell groups along the first direction and are each coupled to a corresponding array element signal terminal through one switch device.

7. The acoustic wave transducer of claim 1, wherein each array element signal terminal is coupled to M adjacent cell groups through M switch devices, each switch device corresponds to one cell group, M is greater than or equal to 2, a number of cell groups in the intersection between the at least two adjacent cell groups coupled to any one of the plurality of array element signal terminals and the at least two adjacent cell groups coupled to the adjacent array element signal terminal is N, N is greater than or equal to 1 and less than M.

8. The acoustic wave transducer of claim 7, wherein M is an even number, and N=M/2.

9. The acoustic wave transducer of claim 1, wherein the acoustic wave transducer cell is a capacitive micromachined ultrasonic transducer, the capacitive micromachined ultrasonic transducer comprises a first electrodes and a second electrodes opposite to each other, the second electrode is coupled to a common signal terminal, first electrodes of the capacitive micromachined ultrasonic transducers in each cell group are coupled together and further coupled to a corresponding array element signal terminal through a corresponding switch device.

10. The acoustic wave transducer of claim 1, wherein the switch device is a micromechanical switch, and the micromechanical switch comprises a control terminal coupled to a control signal terminal, a first terminal electrically coupled to a corresponding cell group and a second terminal electrically coupled to a corresponding array element signal terminal.

11. The acoustic wave transducer of claim 7, wherein $5 \leq M \leq 10$.

12. A driving method of an acoustic wave transducer, the acoustic wave transducer being the acoustic wave transducer of claim 1, the driving method comprises:
   providing a turn-on control signal or a turn-off control signal to each switch device so that at least part of the switch devices coupled to each of the plurality of array element signal terminals are turned on, and each cell group is in electrical connection with only one array element signal terminal.

13. The driving method of claim 12, wherein each array element signal terminal is in electrical connection with a same number of cell groups at a same timing.

14. The driving method of claim 12, wherein each array element signal terminal is in electrical connection with the cell groups adjacent to each other at a same timing.

15. The driving method of claim 14, wherein the plurality of array element signal terminals comprise a first array element signal terminal and a second array element signal terminal which are adjacent; and
   at a same timing, the cell groups in electrical connection with the first array element signal terminal are adjacent to the cell groups in electrical connection with the second array element signal terminal.

16. The driving method of claim 12, wherein the plurality of cell groups are arranged in a first direction;
   at a first timing and a subsequent second timing, the number of the cell groups in electrical connection with each array element signal terminal is unchanged; and
   the first cell group in the first direction of the cell groups in electrical connection with any one of the array element signal terminals at the first timing is adjacent to the first cell group in the first direction of the cell groups in electrical connection with the array element signal terminal at the second timing.

* * * * *